United States Patent
Christiansen et al.

(10) Patent No.: US 9,648,749 B1
(45) Date of Patent: May 9, 2017

(54) CIRCUIT CARD ASSEMBLY AND METHOD OF PROVIDING SAME

(71) Applicants: Martin Brokner Christiansen, Laurel, MD (US); Leonard George Chorosinski, Ellicott City, MD (US); H. Craig Heffner, Ellicott City, MD (US); Stanley Katsuyoshi Wakamiya, Ellicott City, MD (US); Keith R. Kirkwood, Columbia, MD (US)

(72) Inventors: Martin Brokner Christiansen, Laurel, MD (US); Leonard George Chorosinski, Ellicott City, MD (US); H. Craig Heffner, Ellicott City, MD (US); Stanley Katsuyoshi Wakamiya, Ellicott City, MD (US); Keith R. Kirkwood, Columbia, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/943,299

(22) Filed: Nov. 17, 2015

(51) Int. Cl.
*H05K 1/00* (2006.01)
*H05K 1/18* (2006.01)
(Continued)

(52) U.S. Cl.
CPC .......... *H05K 1/181* (2013.01); *H05K 1/0203* (2013.01); *H05K 1/0298* (2013.01);
(Continued)

(58) Field of Classification Search
CPC .... H05K 1/181; H05K 1/0203; H05K 1/0298; H05K 1/0306; H05K 1/115; H05K 3/303; H05K 3/46
(Continued)

(56) References Cited

U.S. PATENT DOCUMENTS

| 4,224,630 A | 9/1980 | Kroger |
| 5,627,139 A | 5/1997 | Chin et al. |

(Continued)

FOREIGN PATENT DOCUMENTS

| DE | 102009056308 A1 | 6/2011 |
| EP | 0669661 A2 | 8/1995 |

OTHER PUBLICATIONS

International Search Report for corresponding PCT/US2016/056446, mailed Feb. 13, 2017.
(Continued)

*Primary Examiner* — Tremesha S Willis
(74) *Attorney, Agent, or Firm* — Tarolli, Sundheim, Covell & Tummino LLP

(57) ABSTRACT

A circuit card assembly includes a substrate having longitudinally spaced first and second substrate end edges and transversely spaced top and bottom substrate surfaces. The top and/or bottom substrate surface has first, second, and third substrate regions. The first substrate region is directly laterally adjacent the first substrate side edge. The third substrate region is directly laterally adjacent the second substrate side edge. The second substrate region is located between the first and third substrate regions. At least one circuit trace is located on the selected substrate surface. The portion of the circuit trace in the first substrate region is made of only a first material. The portion of the circuit trace in the third substrate region is made of only a second material. The portion of the circuit trace in the second substrate region is made of both the first and second materials.

20 Claims, 5 Drawing Sheets

(51) Int. Cl.
*H05K 1/02* (2006.01)
*H05K 1/03* (2006.01)
*H05K 3/46* (2006.01)
*H05K 3/30* (2006.01)
*H05K 1/11* (2006.01)

(52) U.S. Cl.
CPC ........... *H05K 1/0306* (2013.01); *H05K 1/115* (2013.01); *H05K 3/303* (2013.01); *H05K 3/46* (2013.01)

(58) Field of Classification Search
USPC ................. 174/250, 252, 253, 255–258, 260
See application file for complete search history.

(56) References Cited

U.S. PATENT DOCUMENTS

| 5,892,243 | A | 4/1999 | Chan | |
|---|---|---|---|---|
| 2011/0110087 | A1* | 5/2011 | Hochstein | F21V 29/004 362/249.02 |
| 2012/0129291 | A1* | 5/2012 | Stahl | B81C 1/00777 438/50 |
| 2016/0165728 | A1* | 6/2016 | Fullam | H05K 1/18 361/760 |

OTHER PUBLICATIONS

Kawai et al.: "Fabrication of Superconducting Quantum Interference Device Magnetometers on a Glass Epoxy Polyimide Resin Substrate with Copper Terminals"; Physics Procedia, vol. 36, Jan. 1, 2012, pp. 262-267, XP055341252, Amsterdam, NL ISSN: 1875-3892, DOI: 10.1016/j.phpro.2012.06.157; entire document.

* cited by examiner

CIRCUIT CARD ASSEMBLY AND METHOD OF PROVIDING SAME

TECHNICAL FIELD

This disclosure relates to an apparatus of a circuit card assembly and a method for providing a circuit card assembly and, more particularly, to a method of providing a circuit card assembly, and a circuit card assembly apparatus, that is made of first and second materials.

BACKGROUND

A circuit card is the current state of the art for building assemblies of electronic devices including a plurality of integrated circuits ("chips"). These assemblies can be separated into multiple types: organic multilayer laminated printed wire board ("PWB"), low temperature co-fired ceramic ("LTCC"), and high temperature co-fired ceramic ("HTCC"). Using each of these technologies, circuit card assemblies have been fabricated.

In a superconducting supercomputer, many of the operating processing integrated circuits ("chips") are cooled to about 4K, but certain of the memory chips instead have a much warmer operating temperature of about 77K. Providing cooling at 4K is a costly activity, so every effort is made in superconducting supercomputer design to reduce the thermal parasitic load. This includes placing the assembly in vacuum (no convection), use of coatings and multilayer insulation to reduce radiation, and limiting the conductive thermal load between the "hot side" and "cold side" of the entire assembly.

One known method of achieving the desired operating temperatures for a superconducting supercomputer while avoiding thermal parasitic load even involves completely isolating the different-temperature chips in separate containers (e.g., vacuum containers or Dewars). Processing tasks must then be conducted via a very large number of wires extending several feet between the "hot side" and "cold side" containers, which adds considerable expense to the device and also appreciably slows down processing speed due to the distance the signals must travel.

Commonly available circuit cards have a minimum substrate thickness of 0.030" with a deposited metal layer of about 0.0014" thickness providing the circuit traces interconnecting the chips carried by the circuit card. In order to properly connect all the chips at 4K and 77K, the substrate will likely need to be thicker than the "standard" 0.030" thickness, but as thickness increases, the thermal conduction parasitic load increases. The next issue at cryogenic temperature is the thermal expansion mismatch. Because the metal and dielectric layers are on the same order of thickness, the stress induced by changing temperatures between the two sides of the circuit card may lead to circuit card damage or warping. Warping may cause two primary problems: separation from the heatsink and device damage (lead separation).

SUMMARY

In an embodiment, a circuit card assembly is disclosed. A substantially planar substrate has longitudinally spaced first and second substrate end edges, transversely spaced top and bottom substrate surfaces, and laterally spaced first and second substrate side edges. At least a selected one of the top and bottom substrate surfaces has laterally arranged, longitudinally extending first, second, and third substrate regions. The first substrate region is directly laterally adjacent the first substrate side edge. The third substrate region is directly laterally adjacent the second substrate side edge. The second substrate region is located laterally between the first and third substrate regions. At least one circuit trace is located on the selected substrate surface. The portion of the circuit trace located in the first substrate region is made of only a first material. The portion of the circuit trace located in the third substrate region is made of only a second material. The portion of the circuit trace located in the second substrate region is made of both the first and second materials.

In an embodiment, a method of providing a circuit card is disclosed. A substantially planar substrate having longitudinally spaced first and second substrate end edges, transversely spaced top and bottom substrate surfaces, and laterally spaced first and second substrate side edges is provided. On at least a selected one of the top and bottom substrate surfaces, laterally arranged, longitudinally extending first, second, and third substrate regions are defined. The first substrate region is directly laterally adjacent the first substrate side edge. The third substrate region is directly laterally adjacent the second substrate side edge. The second substrate region is located laterally between the first and third substrate regions. At least one circuit trace is provided to the selected substrate surface. At least a portion of the at least one circuit trace in the first substrate region of the selected substrate surface is made from only a first material. At least a portion of the at least one circuit trace in the third substrate region of the selected substrate surface is made from only a second material. At least a portion of the at least one circuit trace in the second substrate region of the selected substrate surface is made from both the first and second materials.

In an embodiment, a dual-temperature circuit card assembly is disclosed. A substrate has at least one substantially planar substrate surface defining a lateral dimension. A first substrate region is defined on a first lateral portion of the substrate surface. The first substrate region is maintained at a first temperature during operation of the circuit card assembly. A third substrate region is defined on a second lateral portion of the substrate surface, laterally spaced from the first lateral side. The third substrate region is maintained at a second temperature, significantly higher than the first temperature, during operation of the circuit card assembly. A second substrate region is defined on the substrate surface laterally between the first and third substrate regions. At least one circuit trace is located on the substrate surface. Any portion of the at least one circuit trace located in the first substrate region is made only of a first material. Any portion of the at least one circuit trace located in the third substrate region is made only of a second material. Any portion of the at least one circuit trace located in the second substrate region is at least partially made of both the second and third materials.

BRIEF DESCRIPTION OF THE DRAWINGS

For a better understanding, reference may be made to the accompanying drawings, in which.

DESCRIPTION OF ASPECTS OF THE DISCLOSURE

This technology comprises, consists of, or consists essentially of the following features, in any combination.

Figure 1:
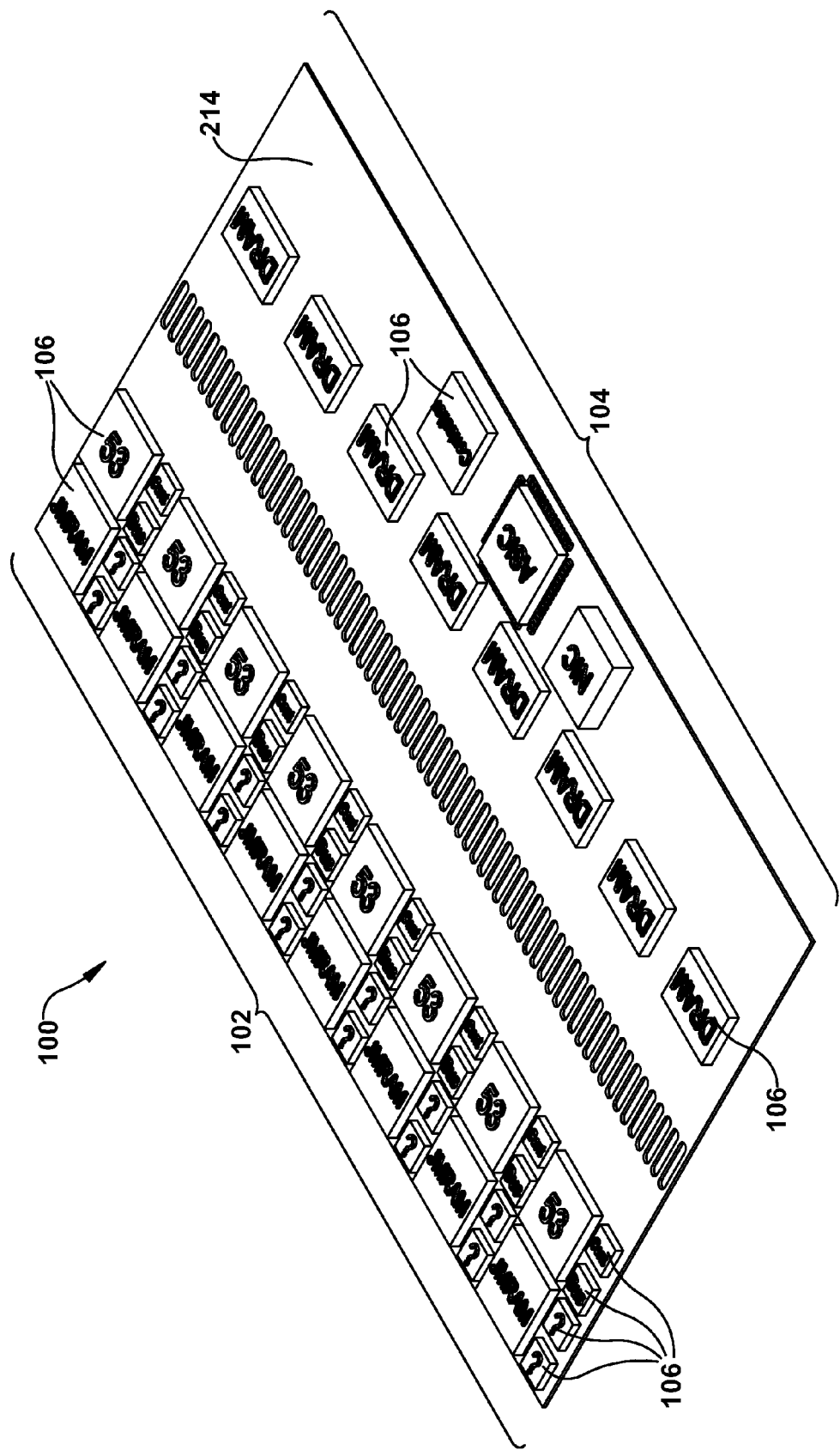
FIG. 1 is perspective top view of one aspect of the invention.

FIG. 1 depicts a circuit card assembly 100 apparatus which can be used in a "hot side"/"cold side" environment. As described herein, the "hot side" (generally indicated by element number 104 in FIG. 1) could be in the range of about 75-79K, and more particularly about 77K, and the "cold side" (generally indicated by element number 102 in FIG. 1) could be in the range of about 2-6K, and more particularly about 4K, but any desired temperature differences could be accommodated with the described circuit card assembly 100. For example, one of ordinary skill in the art could provide desired temperatures to accommodate desired operation of particular integrated circuit chips 106. Moreover, the circuit card assembly 100 could also be used as desired in an isothermal environment.

Figure 2:
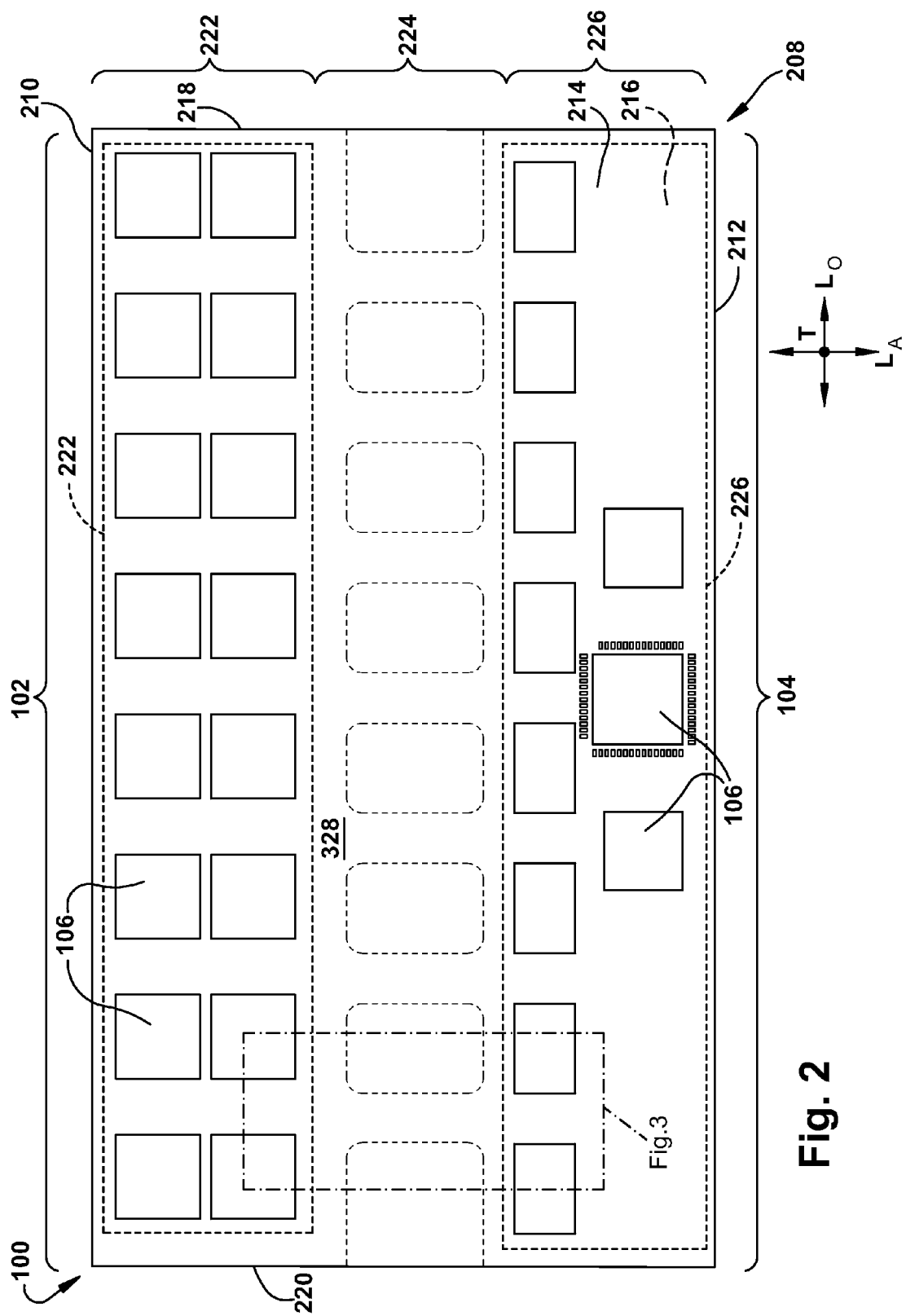
FIG. 2 is a schematic top view of the aspect of FIG. 1.

As shown in FIG. 2, the circuit card assembly 100 includes a substantially planar substrate 208 having longitudinally spaced first and second substrate end edges 210 and 212, respectively, transversely spaced (i.e., a non-zero thickness) top and bottom substrate surfaces 214 and 216, respectively, and laterally spaced first and second substrate side edges 218 and 220, respectively. (The longitudinal direction Lo is defined as the horizontal direction, in the orientation of FIG. 2, with the lateral La and transverse T directions both being orthogonal to the longitudinal direction, as shown.) As shown and described here, the substrate 208 is substantially a rectangular prism, but could have any desired footprint or form factor for a particular use environment.

In addition to, or instead of, commonly used substrate materials such as multilayer printed wire board ("PWB"), the substrate 208 may be substantially made of glass, such as borosilicate glass (which may offer desirable durability and thermal conductivity properties to the circuit card assembly 100), silicon, sapphire, quartz, ceramic, polyimide, liquid crystalline polymer or other low loss organic substrate, or any other suitable materials.

At least a selected one of the top and bottom substrate surfaces 214 and 216 (shown and described herein as being the top substrate surface 214, for ease of depiction) has laterally arranged, longitudinally extending first, second, and third substrate regions 222, 224, and 226, respectively. The first substrate region 222 is directly laterally adjacent the first substrate side edge 210. The third substrate region 226 is directly laterally adjacent the second substrate side edge 212. The second substrate region 224 is located laterally between the first and third substrate regions 222 and 224, as shown in FIG. 2.

During use of the circuit card assembly 100, the first substrate region 222 may be kept at a significantly lower operating temperature ("cold side") than an operating temperature of the third substrate region 226 ("hot side"). The operating temperature of the second substrate region 224 may be in between the hot and cold side operating temperatures. The desired hot and cold side operating temperatures may be achieved in any desirable manner, including via conduction or flow-through heat sinks, thermal siphon cooling cold plates, cooling fluid immersion baths, spray cooling, impingent jet cooling, or any other desired temperature regulating or thermal control mechanism.

Stated differently, a dual-temperature circuit card assembly 100 may include a substrate 208 having at least one substantially planar substrate surface 214 and 216 defining a lateral dimension La. A first substrate region 222 can be defined on a first lateral portion of the substrate surface 214 and 216. The first substrate region 222 is maintained at a first temperature during operation of the circuit card assembly 100. A third substrate region 226 is defined on a second lateral portion of the substrate surface 214 and 216, laterally spaced from the first lateral side. The third substrate region 226 is maintained at a second temperature, significantly higher than the first temperature, during operation of the circuit card assembly 100. A second substrate region 224 is defined on the substrate surface 214 and 216 laterally between the first and third substrate regions 222 and 226.

Figure 3:
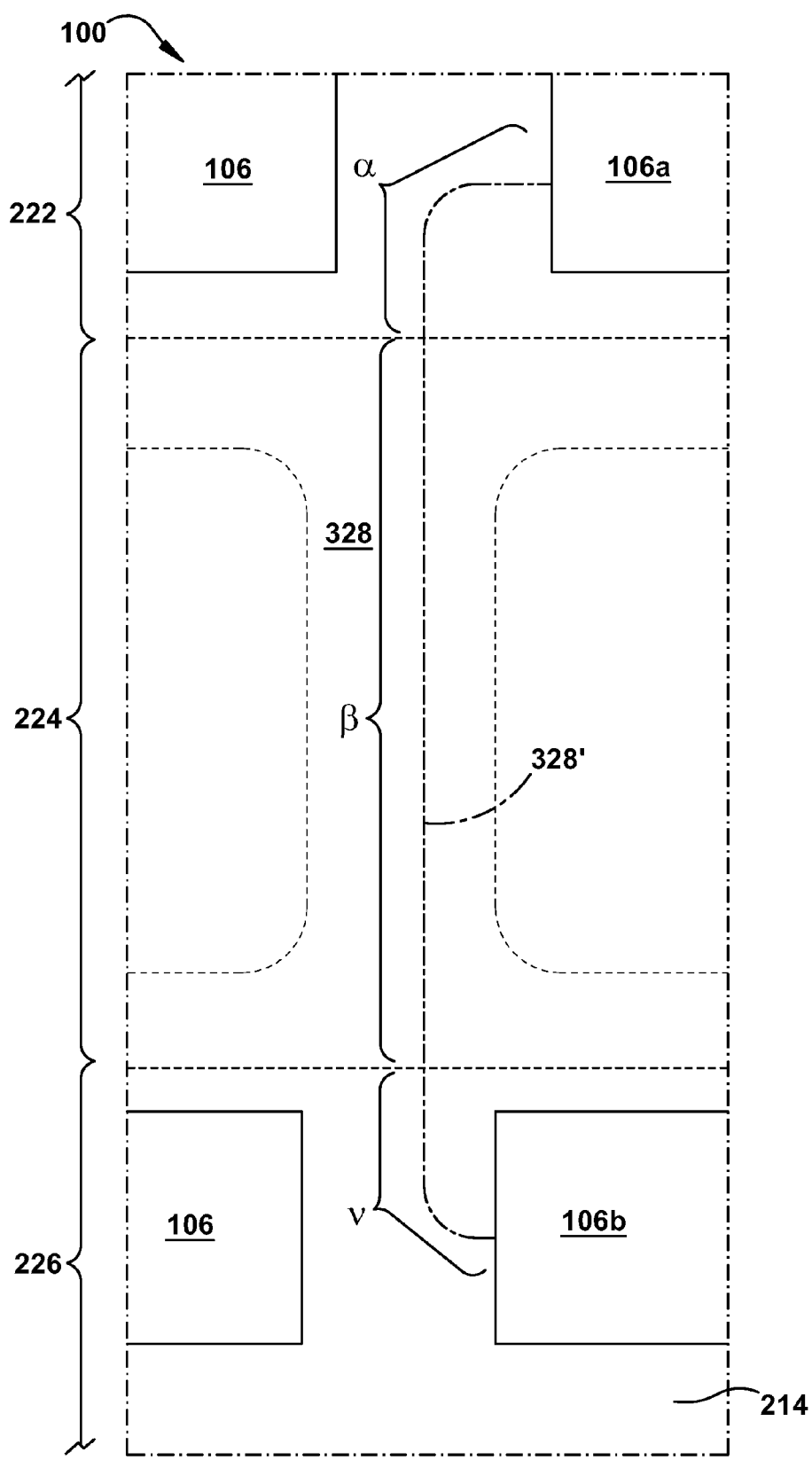
FIG. 3 is a detail view of area "3" of FIG. 2.

With reference to FIG. 3, at least one circuit trace 328 is located on the selected top and/or bottom substrate surface 214 and/or 216 (here, the top substrate surface 214 is shown). The circuit trace 328 is shown schematically in the Figures, for ease of depiction and description, as a general area upon the top substrate surface 214—as a somewhat ladder-shaped region in FIG. 2 and as a substantially I-shaped region in FIG. 3. However, one of ordinary skill in the art will be aware that the areas/regions shown as a "circuit trace" 328 in the Figures could actually be comprised of thousands of extremely small-resolution electrically conductive pathways laid out upon the selected substrate surface, with each pathway leading between different pairs of contacts of various ones of the plurality of chips 106 of the circuit card assembly 100. For example, one individual chip 106 could be linked to and from other chips 106 via over ten thousand individual connections for just that individual chip 106. Moreover, the areas of the top substrate surface 214 shown in the Figures as having, or not having, circuit traces 328 thereupon are not definitive. One of ordinary skill in the art could readily provide circuit traces 328 for a particular use environment of the circuit card assembly 100 without limitation by the dramatically simplified depiction herein. The circuit traces 328 could be provided by lithography, additive manufacturing, or in any other desired manner.

The portion of the circuit trace 328 located in the first substrate region 222 is made of only a first material. The portion of the circuit trace 328 located in the third substrate region 226 is made of only a second material. The portion of the circuit trace 328 located in the second substrate region 224 is made of both the first and second materials. In other words, at least one circuit trace 328 is located on the substrate surface 214, and any portion of the at least one circuit trace 328 which is located in the first substrate region 222 is made only of a first material, any portion of the at least one circuit trace 328 which is located in the third substrate region 226 is made only of a second material, and any portion of the at least one circuit trace 328 which is located in the second substrate region 224 is at least partially made of both the second and third materials.

For example, the first material (in the "cold side" first substrate region 222) may be partially or wholly niobium, and the second material (in the "hot side" third substrate region 226) may be partially or wholly copper. These first and second materials are given as predetermined examples useful in achieving desired performance results for a particular configuration of the circuit card assembly 100, but are not limiting. For example, gold could be used for the first and/or second material as desired, such as if the expense of gold were justified by the conductivity results. Copper and niobium are given as examples here because of the superconductivity properties of niobium at 4K and common processes available for copper at 77K for a particular example use environment of the circuit card assembly. That is, at about 4K, niobium is a superconductor, which may be desirable for a circuit card assembly 100 design. Above the niobium transition temperature of about 9K, however, niobium is a poor conductor, so the circuit trace 328 will transition to copper, in this example, or could transition to any other higher-temperature superconductor.

The circuit trace 328, or portions thereof, may be at least partially formed on the selected top and/or bottom substrate surface(s) 214 and/or 216 via an additive manufacturing process, such as, but not limited to, selective laser sintering (SLS), fused deposition modeling (FDM), direct metal laser sintering (DMLS), stereolithography (SLA), cladding, electron beam melting, electron beam direct manufacturing, aerosol jetting, ink jetting, semi-solid freeform fabrication, digital light processing, 2 photon photopolymerization, laminated object manufacturing (LOM), 3 dimensional printing (3DP), and the like.

The additive manufacturing process for formation of the circuit trace 328, when used, may help provide precise control of the thicknesses of the metal and dielectric layers. This process uses deposition rates on the order of 0.000002 inches/second (5 Angstroms/second), which assists with achievement of predetermined thicknesses of metal traces and dielectric layers. With these parameters under tight process control, RF performance of the circuit card assembly 100 may achieve a desired level. Some example layer thicknesses for the circuit trace 328 are approximately $7.87 \times 10^{-6}$ inches (2000 Angstroms). These extremely thin traces facilitated by additive manufacturing offer a very small cross section, and thus lower thermal parasitic losses than if the layers were made thicker.

The additive manufacturing process also does not require the use of etching and the associated costs of handling of the spent reagents, which may be hazardous and highly reactive. By only printing the material that is needed for the circuit trace 328, material waste may be reduced. In addition, the additive manufacturing processes are compatible with much larger panel sizes than etching, including reel to reel processing, which may further reduce the manufacturing cost, even if the large sections are cut into smaller sizes.

In FIG. 3, one individual circuit trace 328'—representative of the myriad individual connective pathways that could be encompassed within the general "circuit trace" region 328—is shown in dash-dot line extending in a conductive manner between two individual chips 106a and 106b. That is, at least one first operational chip 106a is located in the first substrate region 222 and conductively contacts at least a portion of at least one circuit trace 328' in the first substrate region 222. At least one second operational chip 106b, then, is located in the third substrate region 226 and conductively contacts at least a portion of the same at least one circuit trace 328' in the third substrate region 226, as shown in FIG. 3. Accordingly, the first operational chip 106a is placed into indirect conductive contact with the second operational chip 106b via at least a portion of the at least one circuit trace 328' located in the second substrate region 224. The term "indirect" is used here with reference to this electrical connection to differentiate an "indirect" circuit trace assisted connection from a "direct" chip-to-chip contact.

With further reference to FIG. 3, the portion of the individual circuit trace 328' located in the first substrate region 222 (indicated generally at α) may be made only of the first material, the portion of the individual circuit trace 328' located in the third substrate region 226 (indicated generally at γ) may be made only of the second material, and portion of the individual circuit trace 328' located in the "transitional" second substrate region 224 (indicated generally at β) may be made of both the first and second materials, to assist with transitioning the electrical connection through the intermediate-temperature regions between the "hot side" and the "cold side".

Figure 4:
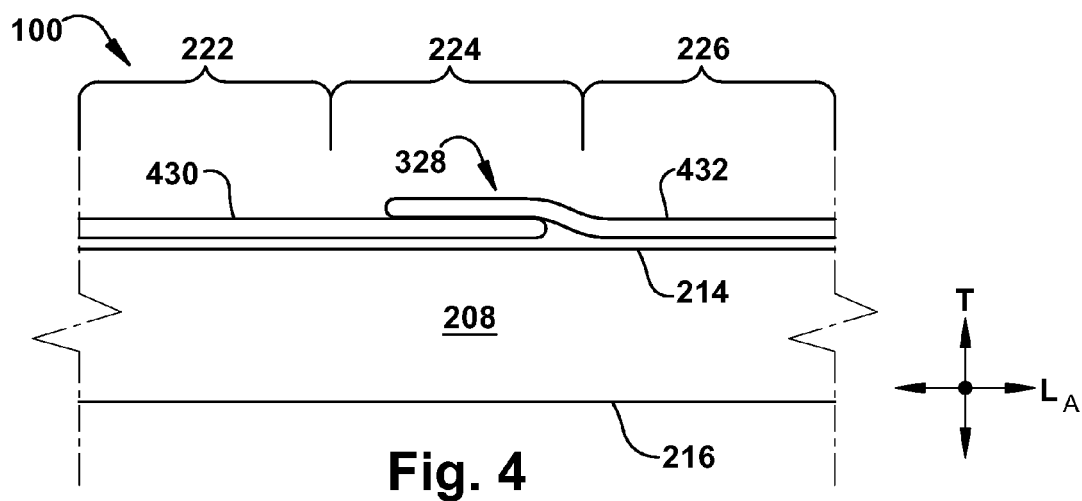
FIG. 4 is a schematic partial side view of the aspect of FIG. 1 in a first configuration.
Figure 5A:
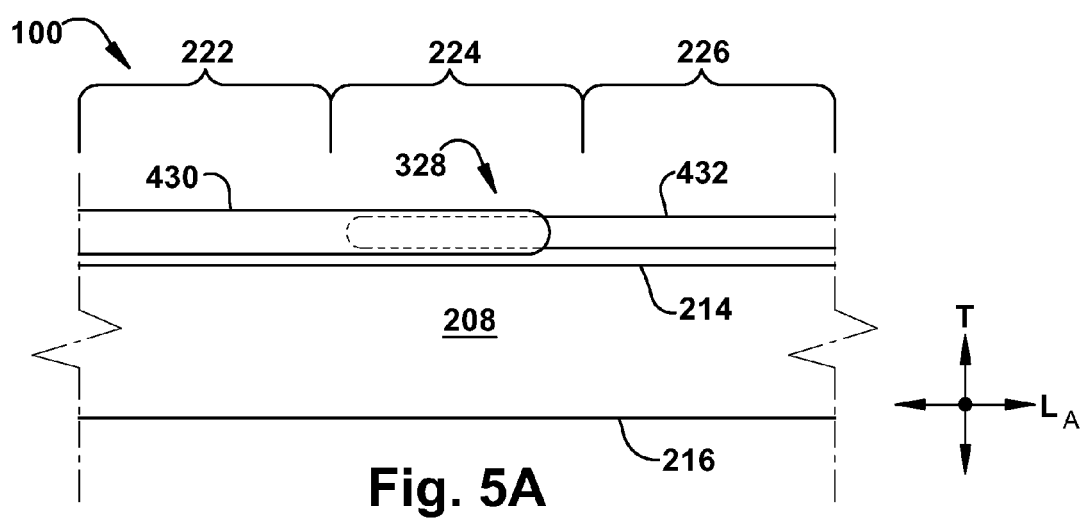
FIG. 5A is a schematic partial side view of the aspect of FIG. 1 in a second configuration.
Figure 5B:
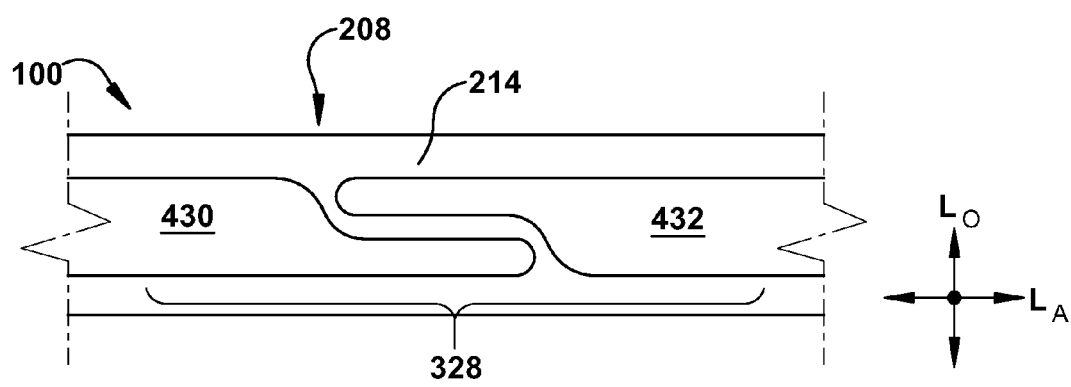
FIG. 5B is a schematic partial top view of the aspect of FIG. 1 in the second configuration of FIG. 5A.

FIGS. 4-5B depict details of the relative positioning of the first and second materials 430 and 432, respectively, in the "transitional" second substrate region 224, in side (FIGS. 4 and 5A) and top (FIG. 5B) views. As shown in these Figures, in the second substrate region 224, the portion of the circuit trace 328 made from the first material 430 is in at least partial conductive contact with the portion of the circuit trace 328 made from the second material 430. More specifically, in the arrangement of FIG. 4, the portion of the circuit trace 328 made from the first material 430 is at least partially arranged in direct transverse contact (up and down, in the orientation of FIG. 4) with at least the portion of the circuit trace 328 made from the second material 432. That is, the second material 432 could lie atop the first material 430 (or vice versa) to attain the desired mutually conductive contact.

Turning to FIGS. 5A-5B, then, in the second substrate region 224, the portion of the circuit trace 328 made from the first material 430 may be at least partially arranged in direct longitudinal contact (into and out of the paper, in the orientation of FIG. 5A, and up and down, in the orientation of FIG. 5B) with at least the portion of the circuit trace 328 made from the second material 432. That is, the second material 432 could lie beside the first material 430 on the first substrate surface 214. The first and second materials 430 and 432 need not be in direct physical contact in the longitudinal arrangement of FIGS. 5A-5B, as long as sufficient electrical contact is made between these portions of the circuit trace 328.

While FIGS. 4-5B schematically depict the first, second, and third substrate regions 222, 224, and 226 in a left-to-right fashion, it is contemplated that the order of these three regions could be reversed, with the labels for the first and second materials 430 and 432 being switched accordingly. That is, the circuit card assembly 100 is agnostic and apathetic as to which of the first and second materials 430 and 432 is located atop (in FIG. 4) or to a particular longitudinal side (in FIGS. 5A-5B) of the other, and one of ordinary skill in the art can readily provide circuit trace(s) 328 having desired first/second material 430/432 construction as desired for a particular use environment. It is also contemplated that various combinations of the transversely and longitudinally arranged first and second materials 430 and 432 could be used in a single circuit card assembly 100, or that the first and second materials 430 and 432 could be place in any desired conducting arrangement with one another, whether or not specifically shown and described herein.

For any arrangement of the first and second materials 430 and 432 making up a single circuit trace 328 in the second substrate region 224, there is no requirement that the materials be placed symmetrically or evenly in any dimension— one of ordinary skill in the art may readily provide any desired layout of the circuit trace(s) 328 in the "transitional" second substrate region 224 as desired. It is merely contemplated that the portion of the circuit trace 328 located in the second substrate region 224 will be made of both the first and second materials 430 and 432—that is, that both the first and second materials 430 and 432 may be found (possibly at varying positions upon the substrate surface and in varying proportions) in that portion of the circuit trace 328 which spans the second substrate region 224. However, it is also contemplated that—even in the second substrate region 224—a portion of the circuit trace 328 located near the transition to the first substrate region 222 may be mostly or wholly made from the first material 430 and a portion of the circuit trace 328 located near the transition to the third substrate region 226 may be mostly or wholly made from the second material 432.

Figure 6:
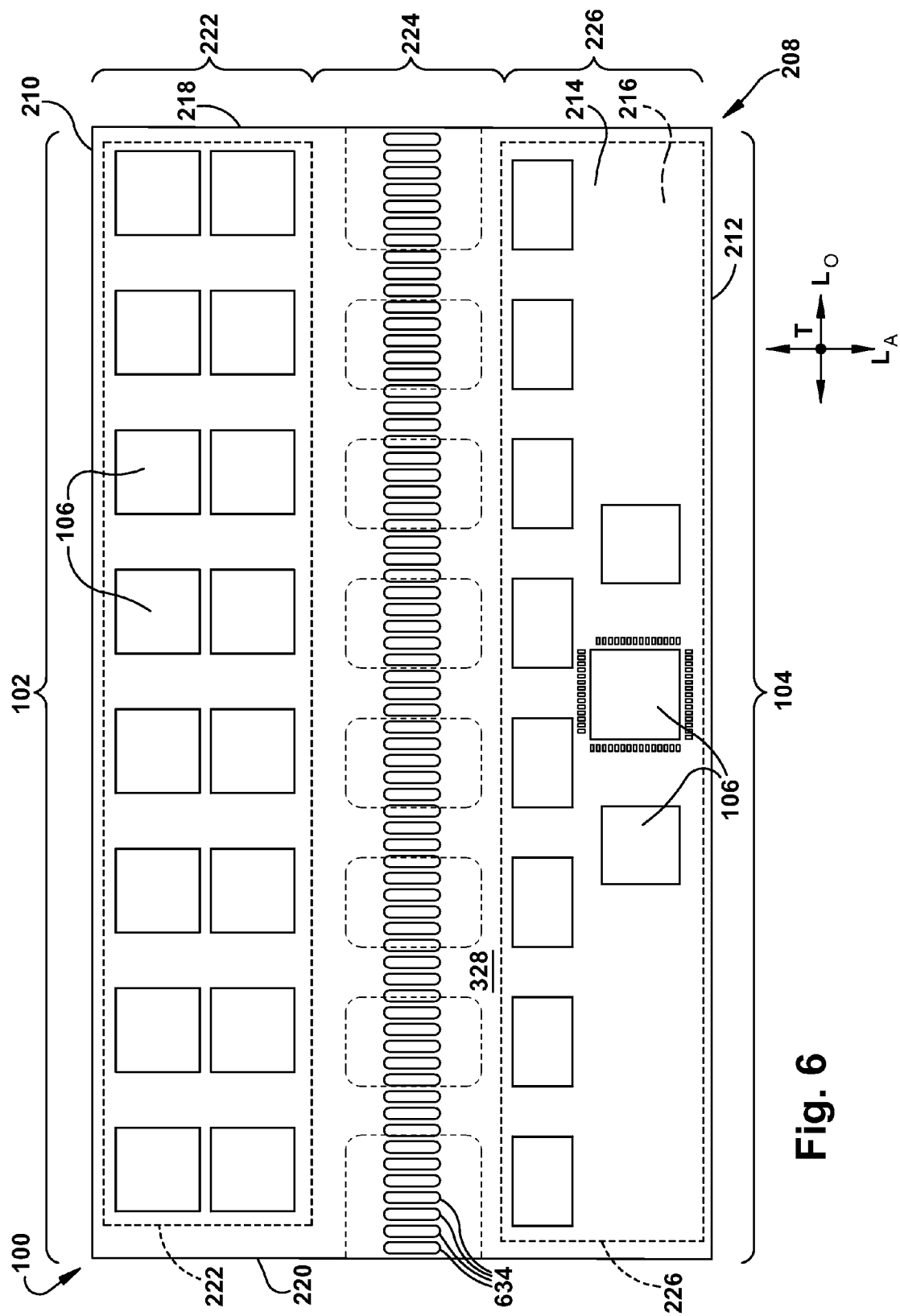
FIG. 6 is a schematic top view of the aspect of FIG. 1.

Finally, the substrate 208 itself could either be substantially even/solid and featureless (as shown in FIG. 2) or could include a plurality of slots 634, as shown in FIG. 6. The substrate 208 can be a significant to the thermal parasitic load of the circuit card assembly 100. One way to reduce thermal transfer through the substrate 208 and thus reduce the overall thermal parasitic load is to make the substrate 208 relatively thin, in the transverse direction—a glass material can be used to make a substrate 208 which is only 0.004" thick. Inclusion of slots 634, such as those shown in FIG. 6, or some other through-aperture(s) or blind cavity (ies) in the substrate 208 can also further reduce the amount of material in a longitudinally-cut cross-section, which can also help control the thermal parasitic loads. Since, for most use environments of the circuit card assembly 100, there will be no chips 106 in the second substrate region 224, that may be a desirable area to include slot(s) 634, though one of ordinary skill in the art can provide and position any desired reduced-material areas (like the slots 634) suitably to achieve desired thermal transfer effects.

In addition to facilitating a very thin cross-section, a glass or other suitable material for the substrate 208 may also help provide a compatible coefficient of thermal expansion (CTE) between the hot and cold sides 104 and 102 of the circuit card assembly 100. By coordinating the CTEs of the various structures of the circuit card assembly 100, the thermal stresses between the chips 106 and the substrate 208 may be reduced, which can help avoid warping, lead detachment, or other undesirable thermal expansion/contraction related effects.

It is also contemplated that a thin copper coating (not shown) or other additional material may be provided to the substrate 208 (particularly upon a surface of the substrate 208 that does not also include conductive circuit traces 328) to assist with controlling thermal transfer as desired.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

We claim:

1. A circuit card assembly, comprising:
   a substantially planar substrate having longitudinally spaced first and second substrate end edges, transversely spaced top and bottom substrate surfaces, and laterally spaced first and second substrate side edges, at least a selected one of the top and bottom substrate surfaces having laterally arranged, longitudinally extending first, second, and third substrate regions, the first substrate region being directly laterally adjacent the first substrate side edge, the third substrate region being directly laterally adjacent the second substrate side edge, and the second substrate region being located laterally between the first and third substrate regions; and
   at least one circuit trace located on the selected substrate surface, with a portion of the circuit trace located in the first substrate region being made of only a first material, a portion of the circuit trace located in the third substrate region being made of only a second material, and a portion of the circuit trace located in the second substrate region being made of both the first and second materials.

2. The circuit card assembly of claim 1, wherein the substrate is substantially made of glass.

3. The circuit card assembly of claim 1, wherein the first material is copper and the second material is niobium.

4. The circuit card assembly of claim 1, wherein, in the second substrate region, the portion of the circuit trace made from the first material is in at least partial conductive contact with the portion of the circuit trace made from the second material.

5. The circuit card assembly of claim 4, wherein, in the second substrate region, the portion of the circuit trace made from the first material is at least partially arranged in direct transverse contact with at least the portion of the circuit trace made from the second material.

6. The circuit card assembly of claim 4, wherein, in the second substrate region, the portion of the circuit trace made from the first material is at least partially arranged in direct longitudinal contact with at least the portion of the circuit trace made from the second material.

7. The circuit card assembly of claim 1, wherein the circuit trace is at least partially formed on the selected substrate surface via an additive manufacturing process.

8. The circuit card assembly of claim 1, wherein, in use, the first substrate region is kept at a significantly lower operating temperature than an operating temperature of the third substrate region.

9. The circuit card assembly of claim 1, including at least one first operational chip located in the first substrate region and conductively contacting at least a portion of the at least one circuit trace in the first substrate region, and including at least one second operational chip located in the third substrate region and conductively contacting at least a portion of the at least one circuit trace in the third substrate region.

10. The circuit card assembly of claim 9, wherein the first operational chip is placed into indirect conductive contact with the second operational chip via at least a portion of the at least one circuit trace located in the second substrate region.

11. A method of providing a circuit card, the method comprising:
    providing a substantially planar substrate having longitudinally spaced first and second substrate end edges, transversely spaced top and bottom substrate surfaces, and laterally spaced first and second substrate side edges;
    defining, on at least a selected one of the top and bottom substrate surfaces, laterally arranged, longitudinally extending first, second, and third substrate regions, the first substrate region being directly laterally adjacent the first substrate side edge, the third substrate region being directly laterally adjacent the second substrate side edge, and the second substrate region being located laterally between the first and third substrate regions; and
    providing at least one circuit trace to the selected substrate surface;
    making at least a portion of the at least one circuit trace in the first substrate region of the selected substrate surface from only a first material;
    making at least a portion of the at least one circuit trace in the third substrate region of the selected substrate surface from only a second material; and
    making at least a portion of the at least one circuit trace in the second substrate region of the selected substrate surface from both the first and second materials.

12. The method of claim 11, wherein making at least a portion of the at least one circuit trace in the second substrate region of the selected substrate surface from both the first and second materials includes placing at least a portion of a circuit trace made from the first material into conductive contact with at least a portion of a circuit trace made from the second material.

13. The method of claim 11, making at least a portion of the at least one circuit trace in the second substrate region of the selected substrate surface from both the first and second materials includes placing at least a portion of a circuit trace made from the first material into direct transverse contact with at least a portion of a circuit trace made from the second material.

14. The method of claim 11, wherein making at least a portion of the at least one circuit trace in the second substrate region of the selected substrate surface from both the first and second materials includes placing at least a portion of a circuit trace made from the first material into direct longitudinal contact with at least a portion of a circuit trace made from the second material.

15. The method of claim 11, wherein providing at least one circuit trace to the selected substrate surface includes forming at least a portion of the circuit trace on the selected substrate surface via an additive manufacturing process.

16. The method of claim 11, including:
    providing at least one first operational chip located in the first substrate region;
    placing the first operational chip into conductive contact with a circuit trace in the first substrate region;
    providing at least one second operational chip located in the third substrate region;
    placing the second operational chip into conductive contact with a circuit trace in the third substrate region; and
    placing the first and second operational chips into indirect conductive contact via at least one circuit trace at least partially located in the second substrate region.

17. A dual-temperature circuit card assembly, comprising:
    a substrate having at least one substantially planar substrate surface defining a lateral dimension;
    a first substrate region defined on a first lateral portion of the substrate surface, the first substrate region being maintained at a first temperature during operation of the circuit card assembly;
    a third substrate region defined on a second lateral portion of the substrate surface, laterally spaced from the first lateral side, the third substrate region being maintained at a second temperature, significantly higher than the first temperature, during operation of the circuit card assembly;
    a second substrate region defined on the substrate surface laterally between the first and third substrate regions;
    at least one circuit trace located on the substrate surface; wherein
    any portion of the at least one circuit trace located in the first substrate region is made only of a first material;
    any portion of the at least one circuit trace located in the third substrate region is made only of a second material; and
    any portion of the at least one circuit trace located in the second substrate region is at least partially made of both the second and third materials.

18. The dual-temperature circuit card assembly of claim 17, wherein, in the second substrate region, a portion of the circuit trace made from the first material is at least partially arranged in at least a chosen one of direct transverse contact and direct longitudinal contact with a portion of the circuit trace made from the second material.

19. The dual-temperature circuit card assembly of claim 17, wherein the circuit trace is at least partially formed on the substrate surface via an additive manufacturing process.

20. The dual-temperature circuit card assembly of claim 17, including:
    at least one first operational chip located in the first substrate region and conductively contacting at least a portion of the at least one circuit trace in the first substrate region;
    at least one second operational chip located in the third substrate region and conductively contacting at least a portion of the at least one circuit trace in the third substrate region; and
    wherein the first operational chip is placed into indirect conductive contact with the second operational chip via at least a portion of the at least one circuit trace located in the second substrate region.

* * * * *